US009306108B2

(12) United States Patent  
Doki et al.

(10) Patent No.: US 9,306,108 B2
(45) Date of Patent: Apr. 5, 2016

(54) RADIATION DETECTOR

(71) Applicant: SHIMADZU CORPORATION, Kyoto (JP)

(72) Inventors: Takahiro Doki, Kyoto (JP); Koichi Tanabe, Kyoto (JP); Toshinori Yoshimuta, Kyoto (JP); Hiroyuki Kishihara, Kyoto (JP); Satoshi Sano, Kyoto (JP)

(73) Assignee: SHIMADZU CORPORATION, Kyoto (JP)

( * ) Notice: Subject to any disclaimer, the term of this patent is extended or adjusted under 35 U.S.C. 154(b) by 0 days.

(21) Appl. No.: 14/595,002

(22) Filed: Jan. 12, 2015

(65) Prior Publication Data

US 2015/0200323 A1  Jul. 16, 2015

(30) Foreign Application Priority Data

Jan. 14, 2014  (JP) .................................. 2014-004192

(51) Int. Cl.
  *H01L 31/00* (2006.01)
  *H01L 31/115* (2006.01)
  *H01L 31/0296* (2006.01)
  *H01L 31/0224* (2006.01)

(52) U.S. Cl.
  CPC .......... *H01L 31/115* (2013.01); *H01L 31/0296* (2013.01); *H01L 31/022408* (2013.01)

(58) Field of Classification Search
  CPC ..................... H01L 31/115; H01L 31/022408; H01L 31/0296
  See application file for complete search history.

(56) References Cited

U.S. PATENT DOCUMENTS

| 5,892,227 A * | 4/1999 | Schieber et al. ......... 250/370.12 |
| 6,512,233 B1 * | 1/2003 | Sato et al. ................ 250/370.13 |
| 8,405,037 B2 * | 3/2013 | Tokuda et al. .......... 250/370.12 |
| 2004/0262497 A1 | 12/2004 | Tokuda et al. |
| 2010/0327172 A1 * | 12/2010 | Tokuda et al. .......... 250/370.08 |
| 2013/0168750 A1 | 7/2013 | Ikhlef et al. |
| 2013/0168796 A1 | 7/2013 | Ikhlef et al. |

FOREIGN PATENT DOCUMENTS

| JP | 2005-19543 | 1/2005 |
| JP | 2013-140962 A | 7/2013 |
| JP | 2013-140975 A | 7/2013 |

* cited by examiner

*Primary Examiner* — Nikolay Yushin

(74) *Attorney, Agent, or Firm* — McDermott Will & Emery LLP

(57) ABSTRACT

In an X-ray strip detector, at least one joining semiconductor film are formed on surface of a sensitive semiconductor film, on the part of X-strips and Y-strips, that is sensitive to incident X-rays to generate electric charge, and on at least an entire sensitive region of a conversion film. The joining semiconductor film has higher resistance value than resistance value of the sensitive semiconductor film. Accordingly, when the electric charge generated in the sensitive semiconductor film are collected in the X-strips and the Y-strips, movement of the electric charge into other adjacent strip electrodes is avoidable. Consequently, crosstalk can be suppressed that the electric charge leak to the adjacent strip electrodes.

10 Claims, 7 Drawing Sheets

E-E

RADIATION DETECTOR

CROSS-REFERENCE TO RELATED APPLICATIONS

This application claims priority to Japanese Patent Application No. 2014-004192 filed Jan. 14, 2014 the subject matter of which is incorporated herein by reference in entirety.

TECHNICAL FIELD

The present invention relates to a radiation detector with a conversion film sensitive to radiation to generate electric charge.

BACKGROUND ART

Examples of a currently-used radiation detector include an X-ray detector. See, for example, Japanese Patent Publication No. 2005-019543A. The X-ray detector is provided in an X-ray fluoroscopy apparatus along with an X-ray tube.

The X-ray detector has two types in terms of detecting X-rays. That is, the two types are indirect conversion and direct conversion types. In the indirect conversion-type X-ray detector, incident X-rays are converted into another type of light with scintillators, and then the light is converted into electric charge with a photodiode or a CCD image sensor, whereby X-rays are detected. In contrast to this, in the direct conversion-type X-ray detector, incident X-rays are converted into electric charge with a semiconductor film, whereby X-rays are detected.

With the indirect conversion-type detector, an X-ray reaction position of the scintillator is shifted from a position where a photodiode catches X-rays. In contrast to this, with the direct conversion-type detector, electric charge (electrons or holes) drift from an X-ray reaction position to collecting electrodes in the semiconductor film directly. Consequently, the direct conversion-type detector achieves position resolution superior to that of the indirect conversion-type detector.

A pixel detector is typically used for such an X-ray detector. The pixel detector is formed by a large number of X-ray detecting elements for detecting X-rays in a planar state. The number of X-ray detecting elements corresponds to the number of pixels. Moreover, the pixel detector adopts an integral reading system. That is, electric charge converted from X-rays are stored in a storage capacitor for a given period of time, and thereafter the stored electric charge are read out with a switching element such as a TFT (thin-film transistor). Instead of the integral reading system, a photon counting detector has been adopted widely. The photon counting detector is used also for certain medical devices.

Examples of the photon counting detector include a strip detector 101 as illustrated in FIG. 1. The strip detector 101 includes an n-type semiconductor film 103 that is sensitive to incident X-rays to generate electric charge, and strip electrodes 105 and 107 in X- and Y-directions, respectively, across the semiconductor film 103. The strip electrodes 105 and 107 are elongated plate electrodes. The strip electrodes 105 and the strip electrodes 107 are each in parallel arrangement.

Moreover, the strip detector 101 in FIG. 1 includes $p^+$ layers 171 between the strip electrodes 105 elongated in the X-direction and the semiconductor film 103. The $p^+$ layer 171 is elongated in the X-direction. The strip detector 101 further includes $n^+$ layers 173 between the strip electrodes 107 elongated in the Y-direction and the semiconductor film 103. The $n^+$ layer 173 is elongated in the Y-direction. Moreover, $p^+$ layers 175 are each provided between two adjacent $n^+$ layers 173. Insulating layers 177 (e.g., $SiO_2$: silicon dioxide) are formed in a portion of the semiconductor film 103 where no strip electrode 105 and 107 is formed.

For instance, the strip detector is used for minute observation with a microfocused X-ray tube in a nondestructive inspecting apparatus as industrial equipment. Specifically, the microfocused X-ray tube is used, and when a two-dimensional sensor has a narrow sensitive region, the strip detector is used since less X-rays enter.

Japanese Patent Publications No. 2013-140962A and 2013-140975A each disclose a method of forming photodiode arrays on a silicon wafer using a through-silicon-via (TSV: through silicon via) electrode technique.

SUMMARY OF INVENTION

Technical Problem

However, the currently-used strip detector has the following drawback upon forming the fine strip electrodes 105 and 107 on the conversion film 103. Specifically, when the electric charge generated from the incident X-rays are collected in strip electrodes 105 and 107, crosstalk may occur that the electric charge leak to other adjacent strip electrodes 105 and 107. This results in degraded space resolution or sensitivity.

The present invention has been made regarding the state of the art noted above, and its one object is to provide a radiation detector that allows suppressed crosstalk.

Solution to Problem

The present invention is constituted as stated below to achieve the above object. One embodiment of the present invention discloses a radiation detector for detecting radiation. The radiation detector includes a conversion film converting incident radiation into electric charge; a plurality of first strip electrodes elongated in a first direction and arranged in parallel on a surface opposite to an radiation incident surface of the conversion film; and a plurality of second strip electrodes elongated in a second direction intersecting the first direction and arranged on either the radiation incident surface or the surface opposite to the radiation incident surface of the conversion film. The conversion film includes a sensitive semiconductor film and at least one joining semiconductor film. The sensitive semiconductor film is sensitive to the incident radiation to generate the electric charge. The joining semiconductor film are formed on surface of the sensitive semiconductor film on the part of the first strip electrodes and the second strip electrodes and on at least an entire sensitive region of the conversion film, and have resistance value higher than resistance value of the sensitive semiconductor film.

With the radiation detector according to the embodiment of the present invention, the joining semiconductor film are formed on the surface of the sensitive semiconductor film on the part of the first strip electrodes and the second strip electrodes and are formed on at least the entire sensitive region of the conversion film. The sensitive semiconductor film is sensitive to the incident radiation to generate the electric charge. The joining semiconductor film has higher resistance value than resistance value of the sensitive semiconductor film. Accordingly, when the electric charge generated in the sensitive semiconductor film are collected in the first and second strip electrodes, movement of the electric charge into other adjacent strip electrodes is avoidable. Consequently, crosstalk can be suppressed that the electric charge leak to the adjacent strip electrodes, leading to improvement of reduction in space resolution and sensitivity.

Moreover, in the radiation detector according to the embodiment of the present invention, the plurality of first strip electrodes and the plurality of second strip electrodes are each so separated as to divide the entire sensitive region of the conversion film in matrix. The radiation detector includes an incident position identifying circuit identifying a radiation incident position for every sensitive region divided in matrix in accordance with the electric charge read out with the separated first strip electrode and the separated second strip electrode.

The first strip electrodes and the second strip electrodes are each so separated as to divide the entire sensitive region of the conversion film in matrix. Accordingly, the incident position identifying circuit identifies the radiation incident position for every sensitive region divided in matrix in accordance with the electric charge read out with the separated first strip electrode and second strip electrode. Specifically, even if two or more radiation beams are incident within a reading time, identification of the radiation incident position is obtainable as long as the beams are incident into different divided sensitive regions. Consequently, the increased number of radiation beams detectable within the reading time is obtainable. This achieves the increased upper limit of dose of radiation and a shortened measuring time for counting the sufficient number of radiation beams.

Moreover, it is preferable that the joining semiconductor film of the radiation detector according to the embodiment of the present invention is composed of any of CdS, ZnS, ZnO, ZnSe, $Sb_2S_3$, and a mixed crystal thereof. This achieves the joining semiconductor film having higher resistance value than resistance value of the sensitive semiconductor film.

Moreover, it is preferable that the sensitive semiconductor film of the radiation detector according to the embodiment of the present invention is composed of any of CdTe, ZnTe, and a mixed crystal thereof. This achieves a radiation detector with highly sensitivity and high efficiency.

Moreover, it is preferable that a halogen element is added to the sensitive semiconductor film in the radiation detector according to the embodiment of the present invention. This achieves an improved mobility of carriers in crystals of the sensitive semiconductor film.

The specification further discloses another embodiment of the radiation detector as under.

In another embodiment of the radiation detector, the second strip electrodes each include a plurality of pixel electrodes on the surface opposite to the radiation incident surface of the conversion film arranged in the first direction and the second direction, and pixel electrode connectors each connecting the pixel electrodes arranged in the second direction for each of rows of the pixel electrodes in the second direction. The first strip electrodes are arranged on the surface opposite to the radiation incident surface of the conversion film alternately to the rows of the pixel electrodes arranged in the first direction.

With the above construction, one-side reading with the surface opposite to the radiation incident surface of the conversion film achieves a function identical to a both-side strip detector. In this case, both a side adjacent to the first strip electrodes and a side adjacent to the second strip electrodes (pixel electrode and pixel electrode connector) correspond to a side opposite to the radiation incident surface of the conversion film. Accordingly, the joining semiconductor film is formed on the surface opposite to the radiation incident surface. Accordingly, when the electric charge generated in the sensitive semiconductor film are collected in the first strip electrodes and pixel electrodes, movement of the electric charge into other adjacent strip electrodes is avoidable. Consequently, crosstalk can be suppressed that the electric charge leak to the adjacent strip electrodes.

Advantageous Effects of Invention

With the radiation detector according to the embodiments of the present invention, the joining semiconductor film are formed on the surface of the sensitive semiconductor film, on the part of the first strip electrodes and the second strip electrodes, that is sensitive to the incident radiation to generate the electric charge, and on at least the entire sensitive region of the conversion film. The joining semiconductor film has higher resistance value than resistance value of the sensitive semiconductor film. Accordingly, when the electric charge generated in the sensitive semiconductor film are collected in the first and second strip electrodes, movement of the electric charge into other adjacent strip electrodes is avoidable. Consequently, crosstalk can be suppressed that the electric charge leak to the adjacent strip electrodes, leading to reduction in space resolution and sensitivity.

It is to be understood that both the foregoing general description and the following detailed description are exemplary and explanatory and are intended to provide further explanation of the invention as claimed.

BRIEF DESCRIPTION OF DRAWINGS

For the purpose of illustrating the invention, there are shown in the drawings several forms which are presently preferred, it being understood, however, that the invention is not limited to the precise arrangement and instrumentalities shown.

DESCRIPTION OF EMBODIMENTS

Figure 1:
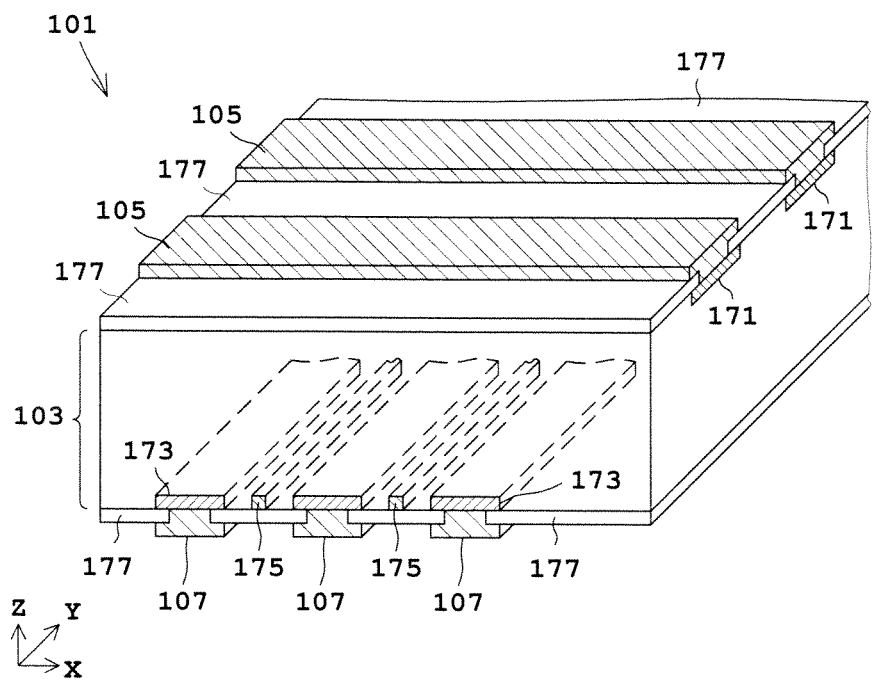
FIG. 1 is a perspective view of a both-side type strip detector currently-used.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

Embodiment 1

Figure 2:
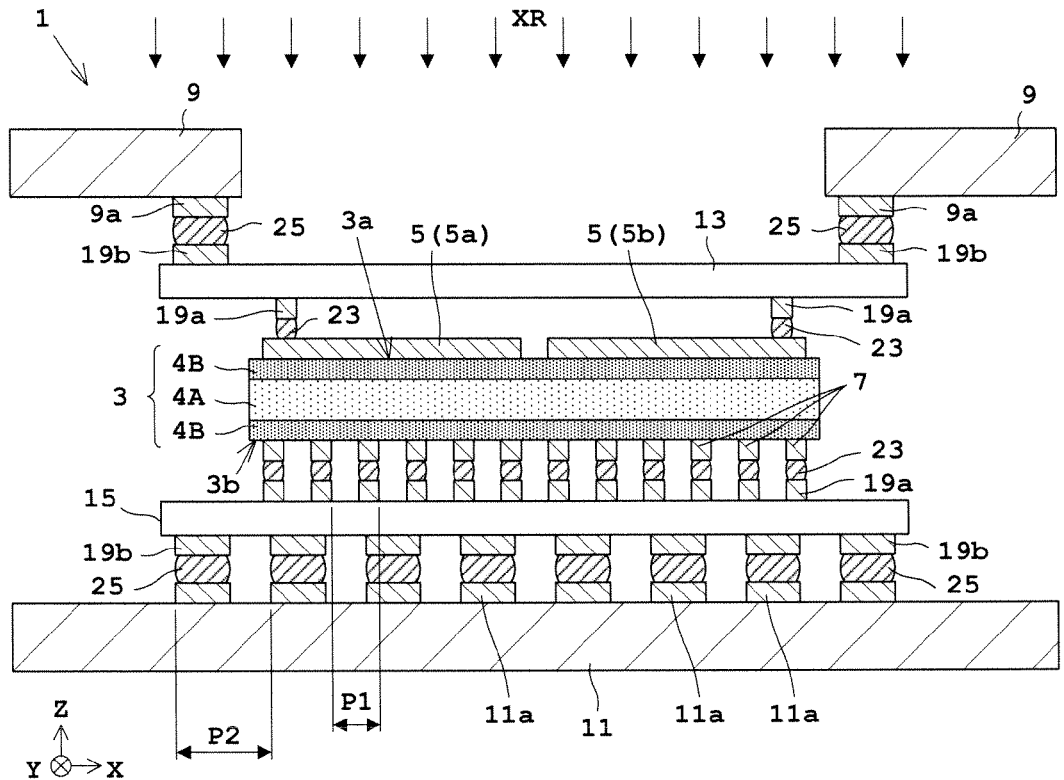
FIG. 2 is a longitudinal sectional view of an X-ray strip detector according to one embodiment of the present invention.
Figure 3:
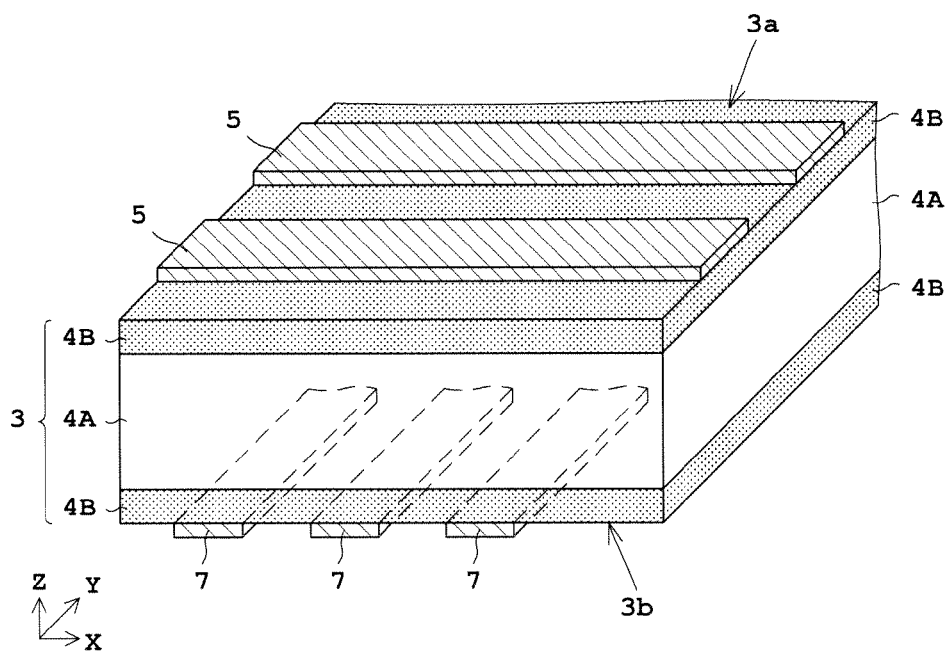
FIG. 3 is a perspective view of a conversion film and strip electrodes in X- and Y-directions.

The following describes embodiments of the present invention with reference to drawings. An X-ray strip detector is to be described as one example of a radiation detector. FIG. 2 is a longitudinal sectional view of an X-ray strip detector according to one embodiment. FIG. 3 is a perspective view of a conversion film and strip electrodes in X- and Y-directions. FIG. 2 illustrates emission of X-rays with a numeral XR. Moreover, "connection" means electrical connection in principle in the embodiment.

<Conversion Film and Strip Electrode>

Reference is made to FIGS. 2 and 3. An X-ray strip detector 1 includes a conversion film (also referred to as a conversion layer) 3 that converts incident X-rays into electric charge.

X-direction strip electrodes 5 elongated in an X-direction (hereinafter, referred to as "X-strips" as appropriate) are arranged on an X-ray incident surface 3a of the conversion film 3. The X-strips 5 are arranged in parallel. Y-direction strip electrodes 7 elongated in a Y-direction (hereinafter, referred to as "Y-strips" as appropriate) orthogonal to (intersecting) the X-direction are arranged on a surface 3b opposite to the X-ray incident surface of the conversion film 3. The Y-strips 7 are arranged in parallel. The X-strip 5 may intersect the Y-strip 7 at another angle (e.g., 88 degrees, i.e., approximately at a right angle). Moreover, the X-strip 5 and the Y-strip 7 are, for example, composed of a conductive material such as Al (aluminum). Furthermore, the X-strip 5 and the Y-strip 7 are elongated plate electrodes.

Bias voltage Vh is applied to the X-strip 5. Accordingly, voltage is applied between the X-strip 5 and the Y-strip 7, causing formation of an electric field within the conversion film 3. Consequently, electrons and holes converted with the conversion film 3 drift in directions opposite to each other, achieving reading of electrons or holes in the X-strip 5 or the Y-strip 7.

Here, the X-ray incident surface 3a corresponds to the radiation incident surface of the present invention. The surface 3b opposite to the X-ray incident surface corresponds to the surface opposite to the radiation incident surface in the present invention. Moreover, the Y-strip 7 corresponds to the first strip electrode in the present invention. The X-strip 5 corresponds to the second strip electrode in the present invention. The Y-direction corresponds to the first direction in the present invention. The X-direction corresponds to the second direction in the present invention.

The conversion film 3 further has the following features. Specifically, as illustrated in FIGS. 2 and 3, the conversion film 3 includes a sensitive semiconductor film 4A and joining semiconductor films 4B. The sensitive semiconductor film 4A is sensitive to incident radiation to generate electric charge. The joining semiconductor film 4B has resistance value higher than resistance value of the sensitive semiconductor film 4A. Hetero-junction is applied between the sensitive semiconductor film 4A and the joining semiconductor films 4B.

The sensitive semiconductor film 4A is composed of any of CdTe (cadmium telluride), ZnTe (zinc telluride), and a mixed crystal thereof (e.g., CdZnTe (Cadmium zinc telluride). This achieves a radiation detector with highly sensitivity and high efficiency. Moreover, the sensitive semiconductor film 4A may be a semiconductor film composed of Si (silicon) or $PbI_2$ (lead iodide), or the like.

A halogen element is added to the sensitive semiconductor film 4A. The halogen element is any of Cl (chlorine), F (fluorine), Br (bromine), and I (iodine). This achieves an improved mobility of crystals within the sensitive semiconductor film 4A.

The joining semiconductor film 4B is composed of any of CdS (cadmium sulfide), ZnS (lead sulfide), ZnO (lead oxide), ZnSe (lead selenide), $Sb_2S_3$ (antimony sulfide), a mixed crystal thereof, or the like. This causes the joining semiconductor device 4B to have higher resistance value than resistance value of the sensitive semiconductor film 4A. The joining semiconductor film 4B with high resistance achieves suppressed movement of electric charge in directions (see the X- and Y-directions in FIG. 3) in which the X-strips 5 and the Y-strips 7 are arranged when the generated electric charge pass through the joining semiconductor films 4B. Here, the joining semiconductor film 4B preferably has a surface resistance (sheet resistance) of more than $10^{12}$ Ω/sq.

Figure 4A:
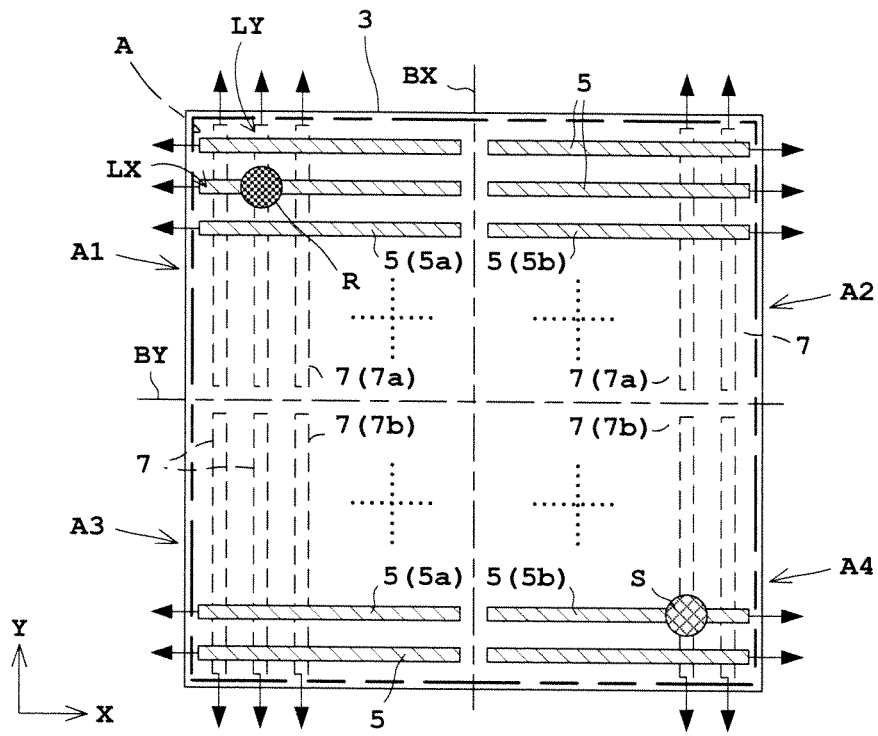
FIG. 4A illustrates a construction identifying X-ray incident positions with four divided sensitive regions.

As illustrated in FIGS. 2 and 3, the joining semiconductor films 4B are formed on the entire or the substantially entire of surfaces of the sensitive semiconductor film 4A on the part of the an X-strips 5 and the Y-strips 7. That is, the joining semiconductor films 4B are formed on the surfaces of the sensitive semiconductor film 4A and on at least an entire sensitive region (sensor area) A of the conversion film 3. FIG. 4A illustrates the entire sensitive region (sensor area) A surrounded by boldface two-dot chain lines. In FIG. 4A, the entire sensitive region A is a region in which a group of X-strips 5 and a group Y-strips 7 are surrounded by one line, respectively. In other words, the entire sensitive region A is an active reading region functioning as a sensor, and corresponds to a region where an image is outputted. The joining semiconductor films 4B are so formed as to embed spaces between adjacent X-strips 5 and between adjacent Y-strips 7. Here, the joining semiconductor films 4B are formed on both surfaces of the sensitive semiconductor film 4A. Alternatively, one of the joining semiconductor films 4B is not necessarily formed.

<Division of Entire Sensitive Region of Conversion Film>

The following describes a construction with the divided entire sensitive region A of the conversion film 3. FIG. 4A illustrates a construction identifying X-ray incident positions with four divided sensitive regions A1 to A4. As noted above, the X-strips 5 and the Y-strips 7 are alternately formed on both surfaces 3a and 3b of the conversion film 3. See FIG. 3. FIG. 4A illustrates the entire sensitive region A as a part of the conversion film 3. Alternatively, the entire sensitive region A may be the entire conversion film 3.

In the embodiment of the present invention, the X-strip 5 and the Y-strip 7 are so separated as to divide the entire sensitive region A of the conversion film 3 in matrix. That is, FIG. 4A illustrates the X-strips 5 each separated by a boundary BX. The separated X-strips 5 are denoted by X-strips 5a and 5b arranged in the X-direction. Moreover, the Y-strips 7 are each separated by a boundary BY. The separated Y-strips 7 are denoted by Y-strip 7a and 7b arranged in the Y-direction. Consequently, in FIG. 4A, an X-ray incident position can be identified in each of the four divided sensitive regions A1 to A4 in 2 by 2 matrix.

<Printed Circuit Board and Interposer>

The following describes a construction for reading the electric charge (electrons and holes) converted with the conversion film 3. Now return to FIG. 2. The electric charge read out with the X-strips 5 and the Y-strips 7 are transmitted to upper and lower printed circuit boards 9 and 11, respectively. The upper printed circuit board 9 has an opening so as not to cover the entire sensitive region A of the conversion film 3 (see FIG. 4). When no differentiation is made between the upper printed circuit board 9 and the lower printed circuit board 11, description is made using the terms printed circuit board 9 and printed circuit board 11.

The printed circuit boards 9 and 11 each typically have a wiring pitch for bump connection of approximately 100 μm. Consequently, if the X-strip 5 and the Y-strip 7 each have a pitch narrower than the wiring pitch of the printed circuit boards 9 and 11 (e.g., 10 μm), bump connection cannot be applied directly between the X-strip 5 and the upper printed circuit board 9 as well as between the Y-strip 7 and the lower printed circuit board 11.

Then, the wiring pitch is enlarged via the upper and lower interposers 13 and 15. This achieves connection between the X-strip 5 and the upper printed circuit board 9 as well as between the Y-strip 7 and the lower printed circuit board 11. When no differentiation is made between the upper interposer 13 and the lower interposer 15, description is made using the terms interposer 13 and interposer 15.

Figure 5A:
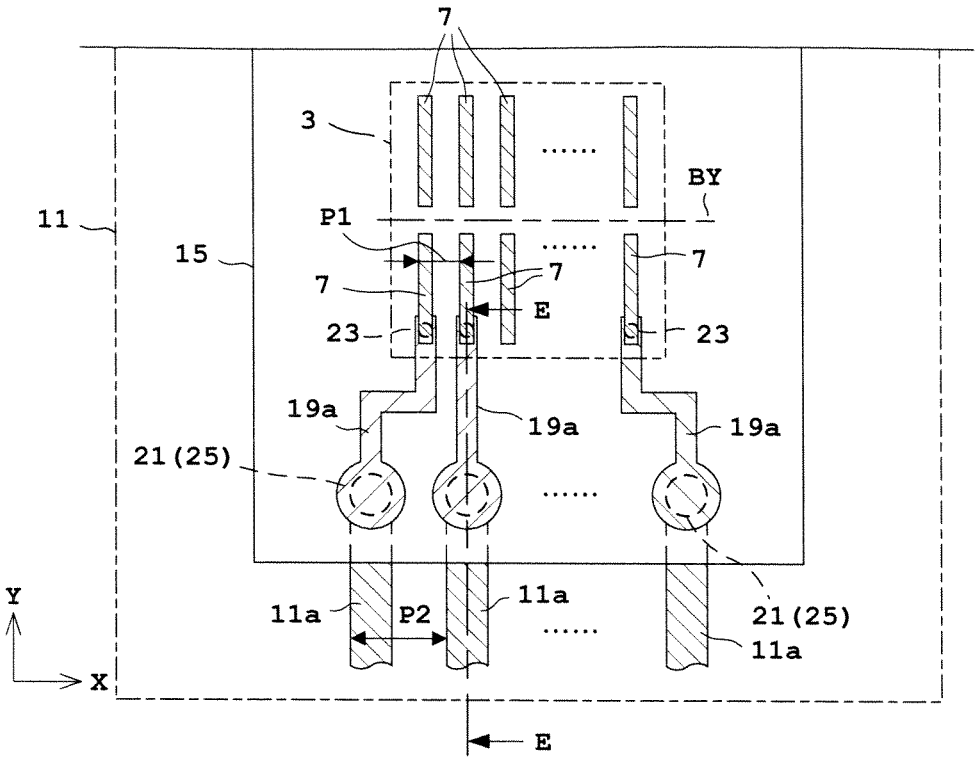
FIG. 5A is a plan view of a lower interposer.
Figure 5B:
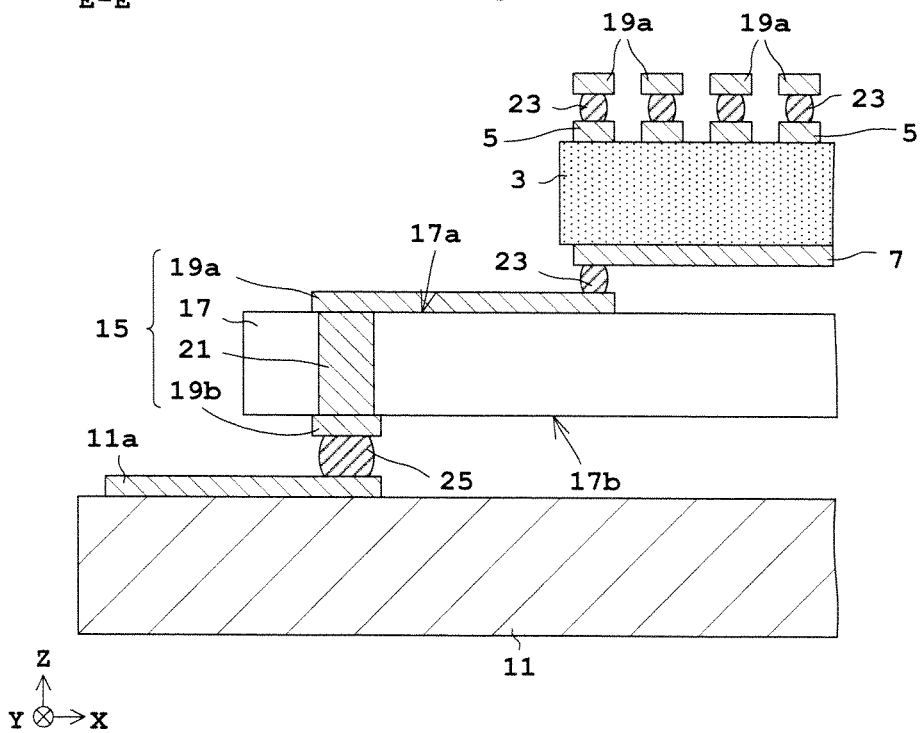
FIG. 5B is a longitudinal sectional view at an E-E portion of FIG. 5A.

The following describes constructions of the interposers 13 and 15 taking the lower interposer 15 as one example. FIG. 5A is a plan view of the lower interposer 15. FIG. 5B is a longitudinal sectional view at an E-E portion of FIG. 5A.

As illustrated in FIG. 5B, the lower interposer 15 includes a substrate 17 made of Si (silicon) or the like. The substrate 17 has a surface 17a on the part of the Y-strip 7 where wires (or electrodes) 19a are formed, and a surface 17b on the part of the lower printed circuit board 11 where wires (or electrodes) 19b are formed. The two types of wires 19a and 19b sandwiching the substrate 17 are connected with each other via a through-silicon-via electrode (hereinafter, referred to as a "TSV" as appropriate) 21. The TSV 21 is formed by filling a through hole in the substrate 17 with a conductive material such as Al. The Y-strip 7 and the wire 19a are connected via a bump 23, such as a solder, composed of a conductive material. Likewise, the wire 11a of the lower printed circuit board 11 and the wire 19b are connected via a bump 25, such as a solder, composed of a conductive material.

As illustrated in FIG. 5A, the lower interposer 15 enlarges a pitch P1 of the Y-strips 7 to be equal to a pitch P2 of the wires 11a of the lower printed circuit board 11, thereby connecting the Y-strips 7 to the wires 11a of the lower printed circuit board 11. Likewise, the upper interposer 13 enlarges a pitch P1 of the X-strips 5 to be equal to a pitch P2 of the wires 9a of the upper printed circuit board 9, thereby connecting the X-strips 5 to the wires 9a of the upper printed circuit board 9. Here, the pitch P1 of the X-strips 5 may be equal to or different from the pitch P1 of the Y-strips 7. Moreover, the pitch P2 of the wires 9a of the upper printed circuit board 9 may be equal to or different from the pitch P2 of the wires 11a of the lower printed circuit board 11.

<Incident Position Identifying Circuit>

Figure 6:
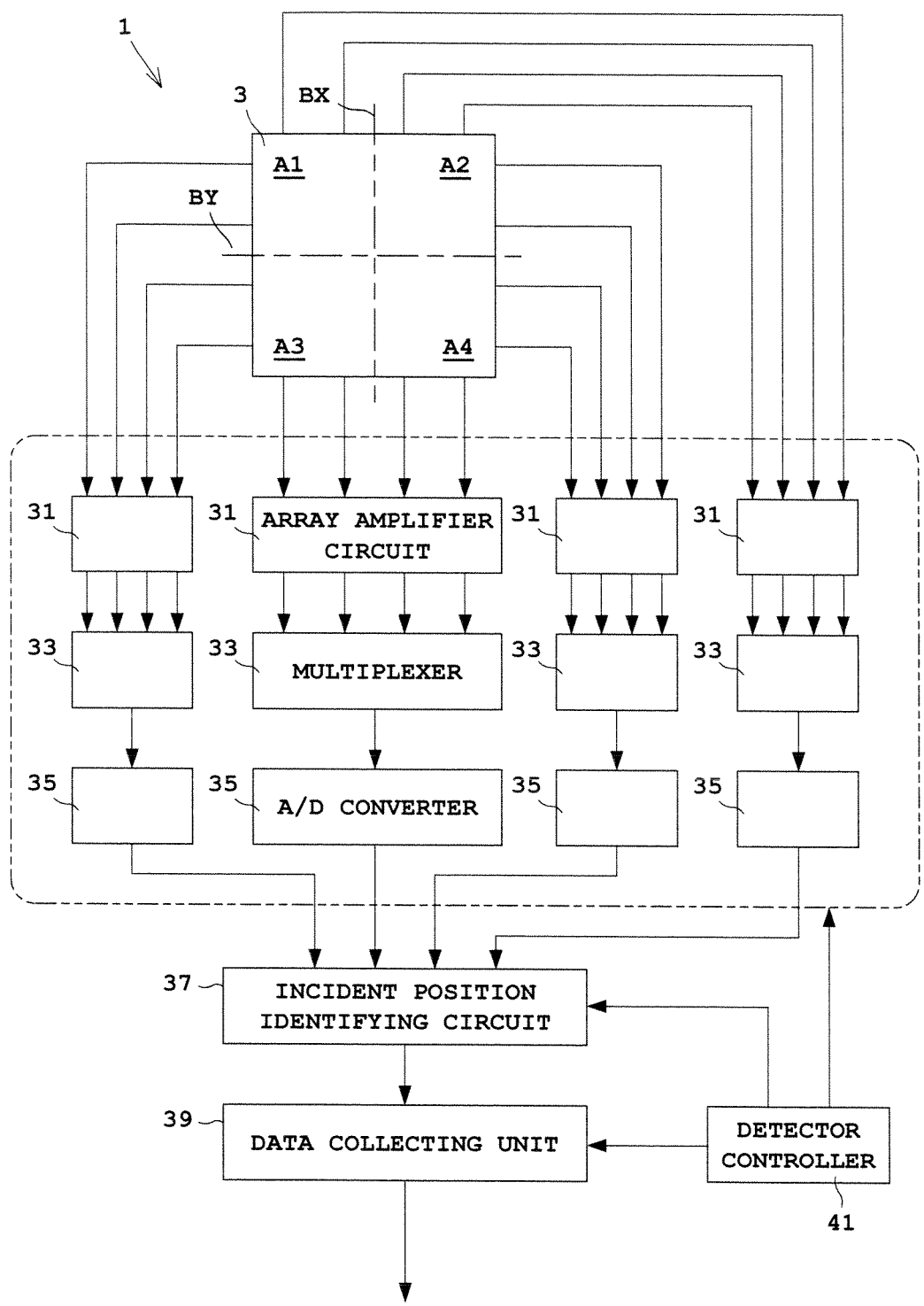
FIG. 6 is a block diagram of the X-ray strip detector according to the embodiment.

The following describes processing of the electric charge read out with the X-strips 5 and the Y-strips 7 and converted with the conversion film 3. FIG. 6 is a block diagram illustrating the X-ray strip detector 1 according to Embodiment 1. In FIG. 6, the printed circuit boards 9 and 11 and the interposers 13 and 15 are each not shown.

Array amplifier circuits 31, multiplexers 33, and A/D converters 35 are connected in this order on each of an output side of the X-strip 5 and the Y-strip 7. The array amplifier circuit 31 converts the electric charge read out with each of the X-strips 5 (Sa, 5b) and the Y-strips 7 (7a, 7b) into voltage signals. The multiplexer 33 selects and outputs one voltage signal from the voltage signals. The A/D converter 35 converts the voltage signal from analog to digital.

Moreover, an incident position identifying circuit 37 and a data collecting unit 39 are located on the output side of the A/D converter 35. The incident position identifying circuit 37 identifies incident positions of X-rays for the four divided sensitive regions A1 to A4 in matrix in accordance with the electric charge read out with the separated X-strips 5a and 5b and the separated Y-strips 7a and 7b. The data collecting unit 39 collects data on the X-ray incident positions identified for the four divided sensitive regions A1 to A4 and the number of incident X-ray beams at the positions.

A detector controller 41 controls en bloc the array amplifier circuits 31, the multiplexers 33, the A/D converters 35, the incident position identifying circuit 37, and the data collecting unit 39. The detector controller 41 performs control so as to repeatedly read the electric charge in a reading time set in advance (0<t≤approximately 1 μs). The data collecting unit 39 outputs an X-ray image in accordance with the data on the X-ray incident positions and the number of incident X-ray beams at the positions. Accordingly, the X-ray strip detector 1 outputs an X-ray image.

At least any of the array amplifier circuits 31, the multiplexers 33, the A/D converters 35, the incident position identifying circuit 37, the data collecting unit 39, and the detector controller 41 is provide on or behind the printed circuit boards 9 and 11.

<Operation of X-Ray Strip Detector>

The following describes operation of the X-ray strip detector 1. Now reference is made to FIG. 2. Bias voltage Vh set in advance is applied to the X-strips 5 of the X-ray strip detector 1. An X-ray tube (not shown) emits X-rays to a subject (not shown). The X-ray strip detector 1 detects X-rays passing through the subject.

When X-rays enter into the conversion film 3 (sensitive semiconductor film 4A) of the X-ray strip detector 1, a photoelectric effect occurs in the conversion film 3 to generate electron-hole pairs. The bias voltage Vh causes an electric field in the conversion film 3. Consequently, the electrons and holes drift in opposite directions. For instance, the electrons are read in the X-strips 5, and the holes are read in the Y-strips 7.

The electrons read in the X-strips 5 are transmitted through the upper interposer 13 to the upper printed circuit board 9. The holes read in the Y-strips 7 are transmitted through the lower interposer 13 to the lower printed circuit board 11.

The array amplifier circuit 31 provided on the output side in FIG. 6 converts the electrons or holes read in the separated X-strips 5a and 5b or the separated Y-strips 7a and 7b into voltage signals. That is, a voltage signal is generated for each of the separated X-strips 5a and 5b and the separated Y-strips 7a and 7b. The multiplexer 33 selects and outputs one voltage signal from the voltage signals. The A/D converter 35 converts the voltage signal from analog to digital. The digitized electric signal is transmitted to the incident position identifying circuit 37.

The incident position identifying circuit 37 identifies an X-ray incident position in the X-strip 5 from intensities of the voltage signals corresponding to the X-strips 5. Likewise, the incident position identifying circuit 37 identifies an X-ray incident position in the Y-strip 7 from intensities of the voltage signals corresponding to the Y-strips 7. The electric charge converted by X-ray incidence are across at least any of the X-strips 5 the Y-strips 7. Consequently, the incident position identifying circuit 37 identifies the maximum value of the voltage signals in the X-strips 5 and the Y-strips 7 as an X-ray incident position.

For instance, as illustrated in FIG. 4A, the incident position identifying circuit 37 identifies an X-strip 5a with an arrow LX as an X-ray incident position, and a Y-strip 7a with an arrow LY as an X-ray incident position. Consequently, one X-ray beam is identified to be incident on an intersection R of the X-strip 5a and the Y-strip 7a with the arrows LX and LY, respectively.

Even when X-rays enter into the position R and S in FIG. 4A in a reading time (0<t≤approximately 1 μs), the incident position identifying unit 37 identifies an incident position for each of the divided sensitive regions A1 to A4 formed by the separated X-strips 5 and Y-strips 7 as long as X-rays enter into different divided sensitive regions A1 and A4.

Figure 4B:
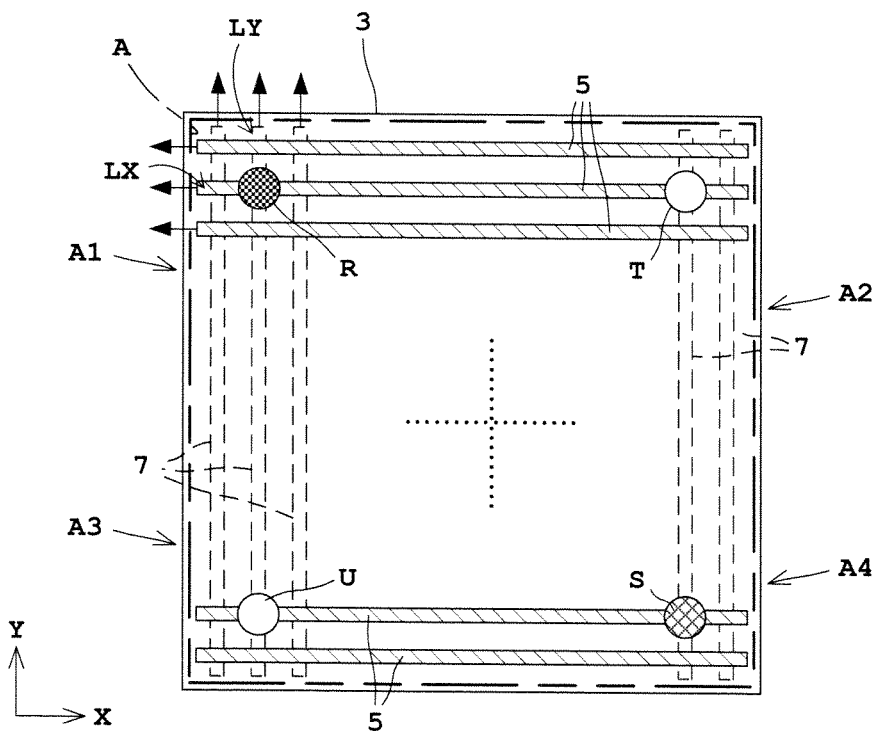
FIG. 4B illustrates a construction identifying X-ray incident positions with an entire sensitive region.

Next FIG. 4B is to be described. FIG. 4B includes X-strips 5 and Y-strip 7 not separated, which differs from FIG. 4A. Accordingly, when X-rays enter into two positions R and S in FIG. 4B in a reading time, positions T and U where no X-ray enters each become a candidate for the incident position in addition to the positions R and S. This may lead to a problem that the X-ray incident position cannot be identified. In such a case, events of X-ray incidence are not adoptable. Accordingly, the upper limit dose of radiation should be lowered in order to prevent drop out of usage of the X-ray incidence events due to incidence of two or more X-ray beams. A larger area of the sensitive region causes possible occurrence of incidence of two or more X-ray beams.

Consequently, as illustrated in FIG. 4A, the X-strips 5 and the Y-strips 7 are separated and the incident position is identified for each of the divided sensitive regions A1 to A4. This prevents the positions T and U where no X-ray actually enters for candidates of the incident position in addition to the position R and S, as illustrated in FIG. 4B. Accordingly, the number of events of X-ray incidence can be reduced that are free from usage due to impossible identification of the incident position. In other words, the number of X-ray beams detectable in a reading time can be increased. This raises the upper limit dose of radiation, achieving a shortened measuring time for counting the number of sufficient X-ray beams.

The data collecting unit 39 collects the data on the X-ray incident positions and the number of X-ray incidence at the positions. The data collecting unit 39, i.e., the X-ray strip detector 1 outputs an X-ray image in accordance with the data on the X-ray incident positions and the number of X-ray incidence at the positions. A needed image processing is conducted to the outputted X-ray image. Then, the X-ray image is displayed on a display unit such as a liquid monitor (not shown), and is stored in a storing unit (not shown).

In the embodiment of the present invention, the joining semiconductor films 4B are formed on surfaces of the sensitive semiconductor film 4A on the part of the X-strips 5 and the Y-strips 7 that are sensitive to incident X-rays to generate electric charge and on at least the entire sensitive region A of the conversion film 3. The joining semiconductor film 4B has higher resistance value than resistance value of the sensitive semiconductor film 4A. Accordingly, when the electric charge generated in the sensitive semiconductor film 4A are collected in the X-strip 5 and the Y-strip 7, movement of the electric charge into another adjacent X-strip 5 and Y-strip 7 is avoidable. Consequently, crosstalk can be suppressed that the electric charge leak to the adjacent X-strip 5 and Y-strip 7, leading to reduction in space resolution and sensitivity.

The X-strip 5 and the Y-strip 7 are so separated as to divide the entire sensitive region A of the conversion film 3 in matrix. Accordingly, the incident position identifying circuit 37 identifies the X-ray incident position for each of the divided sensitive regions A1 to A4 in matrix in accordance with the electric charge read out by the separated X-strips 5 and the Y-strips 7. Specifically, even if two or more X-ray beams are incident within a reading time, the X-ray incident position can be identified as long as the beams are incident into different divided sensitive regions A1 to A4. Consequently, the increased number of X-ray beams detectable within the reading time is obtainable. This achieves the increased upper limit dose or X-rays and a shortened measuring time for counting the sufficient number of X-ray beams.

The wires 19a on the interposers 13 and 15 on the part of the conversion film 3 apply bump connection between the X-strip 5 and the Y-strip 7. Such bump connection achieves a construction with no drawn wire obtained by wire bonding, leading to reading out with a simple circuit.

Embodiment 2

The following describes Embodiment 2 of the present invention with reference to drawings. Here, the description common to that of Embodiment 1 is to be omitted.

In Embodiment 1, the electric charge are read out on both the X-ray incident surface 3a and the surface 3b opposite to the X-ray incident surface of the conversion film 3 for identifying two-dimensional X-ray incident positions. Accordingly, the joining semiconductor films 4B are formed on the both surfaces of the sensitive semiconductor film 4A. In contrast to this, in Embodiment 2, the joining semiconductor film 4B is formed on one surface of the sensitive semiconductor film 4A.

Figure 7:
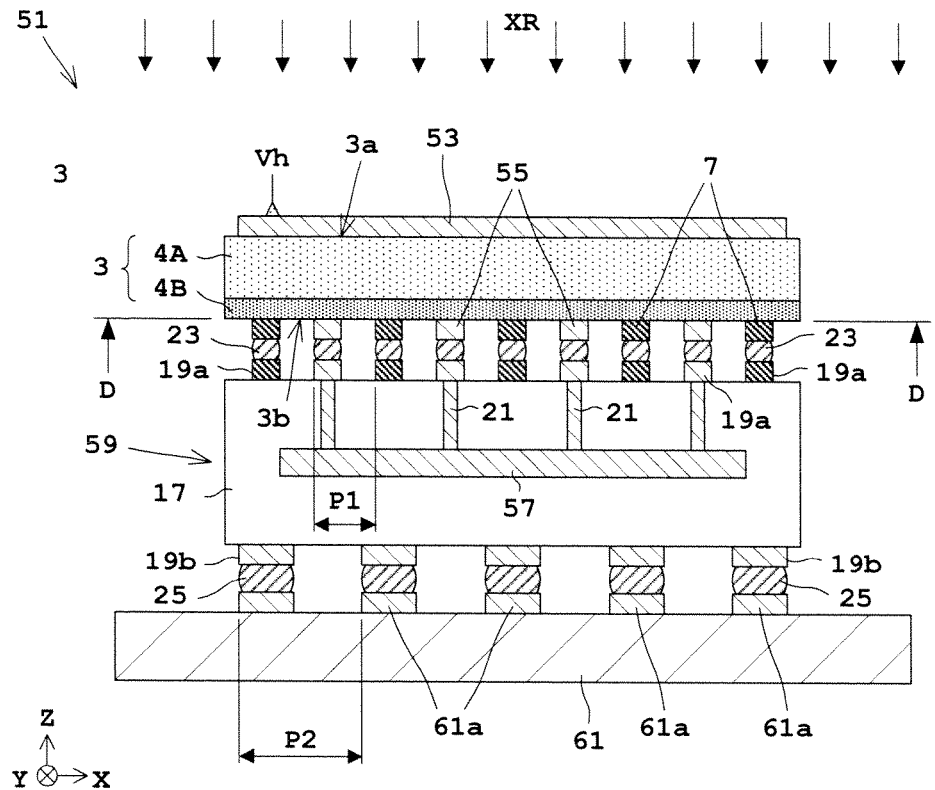
FIG. 7 is a longitudinal sectional view of an X-ray strip detector according to another embodiment of the present invention.
Figure 8:
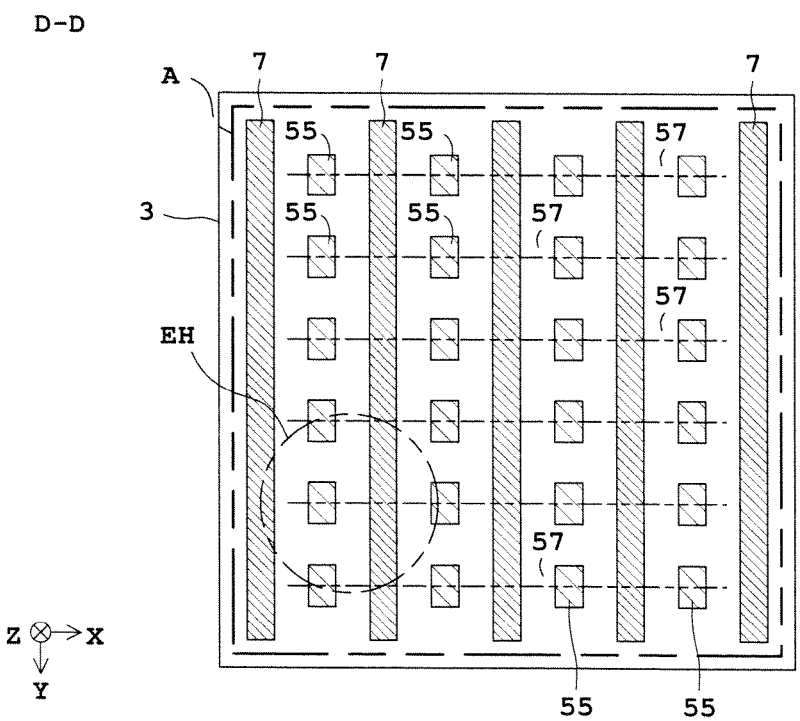
FIG. 8 illustrates a construction identifying X-ray incident positions with an entire sensitive region seen from a surface opposite to the X-ray incident surface of the conversion film.

FIG. 7 is a longitudinal sectional view of an X-ray strip detector according to Embodiment 2. FIG. 8 illustrates a construction of identifying the X-ray incident position with the entire sensitive region seen from the surface opposite to the X-rays incident surface of the conversion film. That is, FIG. 8 is a view seen in a D-direction in FIG. 7. As illustrated in FIG. 7, the X-ray strip detector 51 of Embodiment 2 includes a joining semiconductor film 4B formed on only one surface 3b opposite to the X-rays incident surface of the conversion film 3.

<Common Electrode, Pixel Electrode, and Strip Electrode in Y-Direction>

The X-ray strip detector 51 in FIG. 7 includes a common electrode 53 on the X-ray incident surface 3a of the conversion film 3 so as to cover the X-ray incident surface 3a. The common electrode 53 is provided on almost the entire X-ray incident surface 3a of the conversion film 3. The surface 3b opposite to the X-ray incident surface of the conversion film 3 contains pixel electrodes 55 and Y-strips 7.

As illustrated in FIG. 8, the pixel electrodes 55 are arranged within the surface 3b opposite to the radiation incident surface of the conversion film 3 in X- and Y-directions intersecting each other. In other words, the pixel electrodes 55 are arranged in matrix. The Y-strip 7 and the pixel electrodes 55 in row in the Y-direction are arranged alternately within the surface 3b opposite to the radiation incident surface of the conversion film 3. The common electrode 53 and the pixel electrode 55 are made of a conductive material. The pixel electrode 55 is composed of Al (aluminum), for example.

Bias voltage Vh is applied to the common electrode 53. Accordingly, when voltage is applied between the common electrode 53 and the pixel electrode 55 as well as the common electrode 53 and the Y-strips 7, an electric field is generated within the conversion film 3. Consequently, electrons and holes converted with the conversion film 3 drift in the directions opposite to each other, achieving reading out of electrons or holes in the pixel electrode 55 and the Y-strip 7 on one surface of the conversion film 3. Incidence of one beam X-ray into the conversion film 3 (sensitive semiconductor film 4A) causes generation of approximately one thousand to ten thousands of electron-hole pairs. As illustrated by a portion with a numeral EH in FIG. 8, electric charge (electrons or holes) are read out across the pixel electrodes 55 and the Y-strips 7.

<Printed Circuit Board and Interposer>

As illustrated in FIG. 8, the X-ray strip detector 51 includes pixel electrode connectors 57 each connecting the pixel electrodes 55 in the X-direction for every row of pixel electrodes 55 arranged in the X-direction. The pixel electrode connector 57 connects each of the pixel electrodes 55 in the X-direction, thereby functioning as the X-strip 5 intersecting the Y-strip 7. Accordingly, the Y-strip 7 and the pixel electrode connector 57 intersecting each other can identify the incident positions of X-rays. Here, the pixel electrode 55 and pixel electrode connector 57 are electrically insulated from the Y-strip 7. The pixel electrode 55 and the pixel electrode connector 57 correspond to the second strip electrode in the present invention.

As illustrated in FIG. 7, the pixel electrode connector 57 is formed in the interposer 59. The X-ray strip detector 51 includes a printed circuit board 61 having wires 61a for reading out the electric charge. The interposer 59 is provided between the conversion film 3 and the printed circuit board 61 so as to cover the surface 3b opposite to the X-ray incident surface of the conversion film 3. The interposer 59 having the pixel electrode connectors 57 between the conversion film 3 and the printed circuit board 61 achieves a simplified construction of the circuit such as the pixel electrode connector 57.

The wire 19a on the interposer 59 on the part of the conversion film 3 is connected to the pixel electrode 55 and the Y-strip 7. A bump 23 applies bump connection between the wire 19a and the pixel electrode 55 as well as between the wire 19a and the Y-strip 7. The bump connection achieves drawing of the wires even with fine pitches between the pixel electrode 55 and the Y-strip 7. The wire 19a and the pixel electrode connector 57 are connected via the TSV 21.

In FIG. 7, the wire 19a connected with the Y-strip 7 connects an opposite wire 19b via a TSV not shown. The pixel electrode connector 57 connects the wire 19b via a TSV not shown. The bump 25 applies bump connection between the wire 19b and a wire 61a of the printed circuit board 61. Such a construction allows reading of the electric charge read out with the pixel electrode 55 and the Y-strip 7 also into the printed circuit board 61.

As illustrated in FIG. 7, the interposer 59 is located between the conversion film 3 and the printed circuit board 61. Consequently, as mentioned above, a pitch P1 between the pixel electrode 55 and the Y-strip 7 are enlarged to be equal to a pitch P2 of the wires 61a of the printed circuit board 61, whereby the pixel electrode 55 and the Y-strip 7 are connected to the wire 61a. This achieves connection of the pixel electrode 55 and the Y-strip 7 to the wires 61a of the printed circuit board 13 even with a narrow pitch P1 between the pixel electrode 55 and the Y-strip 7.

<Division of Entire Sensitive Region of Conversion Film>

The following describes a construction identifying an X-ray incident position for each of four divided sensitive regions A1 to A4 of the entire sensitive region A in FIG. 7 in 2 by 2 matrix.

Figure 9:
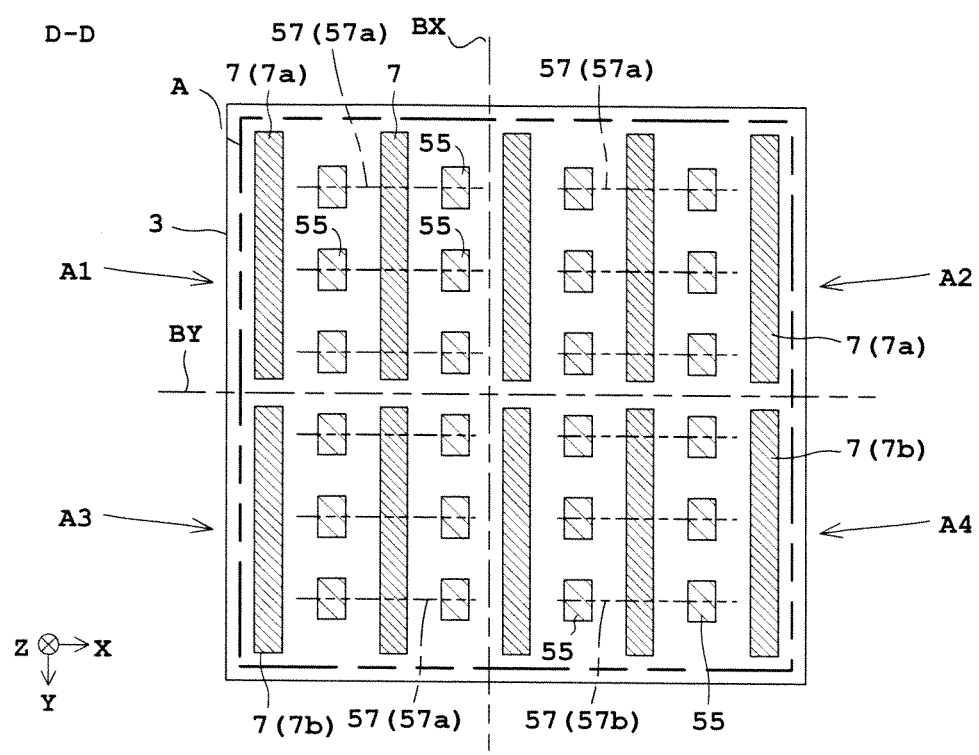
FIG. 9 illustrates the construction identifying the X-ray incident positions with four divided sensitive regions seen from the surface opposite to the X-ray incident surface of the conversion film.

FIG. 9 illustrates the conversion film 3 seen from the surface 3b opposite to the X-rays incident surface. The Y-strip 7 is so separated as to divide the entire sensitive region A of the conversion film 3 in matrix. In FIG. 9, the Y-strip 7 is separated at a boundary BY. The separated Y-strips 7 are denoted by Y-strips 7a and 7b arranged in the Y-direction.

Likewise, the pixel electrode connector 57 is so separated as to divide the entire sensitive region A of the conversion film 3 in matrix. In FIG. 9, the pixel electrode connector 57 is separated at a boundary BX. That is, rows of pixel electrodes 55 in the X-direction are connected by two (i.e., a plurality of) pixel electrode connectors 57a and 57b so as to be separated at the boundary BX and to divide the entire sensitive region A of the conversion film 3. As noted above, in FIG. 9, the X-ray incident position is identified for each of the four divided sensitive regions A1 to A4 in 2 by 2 matrix.

In the embodiment, the common electrode 53 is provided on the X-ray incident surface 3a of the conversion film 3, and the pixel electrode 55 and the Y-strip 7 are provided on the surface 3b opposite to the X-ray incident surface. The pixel electrodes 55 are arranged in the X- and Y-directions intersecting each other. Each of the pixel electrodes 55 in the X-direction is connected to the pixel electrode connector 57 for every row of the pixel electrodes 55 in the X-direction. The Y-strips 7 are elongated in the Y-direction. The Y-strip 7 and the pixel electrodes 55 arranged in the Y-direction are arranged alternately. The pixel electrode 55 and the pixel electrode connector 57 function as the X-direction strip electrodes elongated in the X-direction. These achieve the same function as the both-side strip detector by one-side reading out with the surface 3b opposite to the X-ray incident surface of the conversion film 3.

Moreover, the both-side strip detector needs a construction such as a read-out circuit also on the radiation incident surface 3a. This causes a complicated circuit construction. However, with the embodiment of the present invention, one-side reading causes collection of read-out circuits on the surface 3b opposite to the radiation incident surface. This achieves a simplified circuit construction.

Moreover, one-side reading with the surface 3b opposite to the radiation incident surface of the conversion film 3 achieves the same function as the both-side strip detector (see FIG. 2). In this case, a side adjacent to the Y-strips 7 and a side adjacent to the pixel electrodes 55 and the pixel electrode connector 57 correspond to a side adjacent to the surface 3b opposite to the X-ray incident surface of the conversion film 3. Accordingly, the joining semiconductor film 4B is formed on the surface 3b opposite to the X-ray incident surface. Accordingly, when the electric charge generated in the sensitive semiconductor film 4A are collected in the Y-strip 7 and the pixel electrodes 55, movement of the electric charge into another adjacent Y-strip 7 and pixel electrodes 55 is avoidable. Consequently, crosstalk can be suppressed that the electric charge leak to the adjacent Y-strip 7 and pixel electrodes 55.

The present invention is not limited to the foregoing embodiments, but may be modified as follows.

(1) In Embodiment 1 mentioned above, the two joining semiconductor films 4B may each be made of the same material or different materials. Moreover, in each of the embodiments, the joining semiconductor films 4B may each be formed by a p-type or n-type semiconductor device for suppressing influence from dark current. For instance, in Embodiment 1, the joining semiconductor film 4B where the X-strips 5 are arranged may be formed by a p-type semiconductor device of such as $Sb_2S_3$ with high resistance. The joining semiconductor film 4B where the Y-strips 7 are arranged may be formed by an n-type semiconductor device of such as $Sb_2S_3$ with high resistance.

(2) In each of the embodiments and the modification mentioned above, the entire sensitive region A is divided in 2 by 2 matrix. Alternatively, division in 2-by 1 matrix, 1 by 2 matrix, 2 by 3 matrix, 3 by 2 matrix, and 3 or more by 3 or more matrix may be performed. In 3 or more by 3 or more matrix, the interposer 13, 15 and 59 achieves ready reading of the electric charge from also a divided sensitive region at the center of the entire sensitive region A out of the ends of the entire sensitive region A.

(3) In each of the embodiments and the modification mentioned above, X-rays are one example of radiation to be detected. Alternatively, gamma-rays or infrared light may be adopted. In the embodiment of the present invention, radiation includes photons, and the photons include an electromagnetic wave such as X-rays, gamma-rays, and infrared light.

(4) In each of the embodiments and the modification mentioned above, the first direction corresponds to the Y-direction, and the second direction corresponds to the X-direction. However, this is not limitative. Specifically, the first direction corresponds to the X-direction and the second direction corresponds to the Y-direction. Such a reverse manner is adoptable. Moreover, as long as the first direction intersects the second direction (substantially at a right angle), the X- and Y-direction are not limitative.

(5) In each of the embodiments and the modification mentioned above, the Y-strips 7 and the pixel electrodes 55 arranged in the Y-direction are provided alternately for every one row in FIGS. 8 and 9. However, two rows of Y-strips 7 and two rows of pixel electrodes 55 arranged in the Y-direction may be provided alternately. Moreover, one row of Y-strips 7 and two rows of pixel electrodes 55 arranged in the Y-direction may be provided alternately.

The present invention may be embodied in other specific forms without departing from the spirit or essential attributes thereof and, accordingly, reference should be made to the appended claims, rather than to the foregoing specification, as indicating the scope of the invention.

REFERENCE SIGNS LIST 1, 51 . . . X-ray strip detector
3 . . . conversion film
3a . . . X-ray incident surface
3b . . . surface opposite to X-ray incident surface
4A . . . sensitive semiconductor film
4B . . . joining semiconductor film
5 . . . X-direction strip electrode (X-strip)
7 . . . Y-direction strip electrode (Y-strip)
37 . . . incident position identifying circuit
55 . . . pixel electrode (part of X-strip)
57 . . . pixel electrode connector (part of X-strip)
A . . . entire sensitive region
A1 to A4 . . . divided sensitive region

What is claimed is:

1. A radiation detector for detecting radiation, comprising:
a conversion film, having a first surface and a second surface opposite to the first surface, for converting radiation incident on the first surface into an electric charge;
a plurality of first strip electrodes elongated in a first direction and arranged in parallel with each other on the second surface of the conversion film; and
a plurality of second strip electrodes elongated in a second direction intersecting the first direction and arranged in parallel with each other on the first surface of the conversion film,
the conversion film including a sensitive semiconductor film and joining semiconductor films,
the sensitive semiconductor film being sensitive to the incident radiation to generate the electric charge, and
the joining semiconductor films being formed respectively on surfaces of the sensitive semiconductor film, the surfaces of the sensitive semiconductor film being on the sides of the first and second surfaces, respectively, the joining semiconductor films each covering at least an entire sensitive region in the corresponding surface of the sensitive semiconductor film, each having a resistance value higher than resistance value of the sensitive semiconductor film, and achieving suppressed movement of the electric charge generated in the sensitive semiconductor film in directions in which the first strip electrodes and the second strip electrodes are arranged when the electric charge passes through the joining semiconductor films.

2. The radiation detector according to claim 1, wherein
the plurality of first strip electrodes and the plurality of second strip electrodes are each so separated as to divide the entire sensitive region of the conversion film in matrix, and
the radiation detector further includes an incident position identifying circuit identifying a radiation incident position for every sensitive region divided in matrix in accordance with the electric charge read out with the separated first strip electrode and the separated second strip electrode.

3. The radiation detector according to claim 1, wherein
the joining semiconductor films are composed of any of CdS, ZnS, ZnO, ZnSe, $Sb_2S_3$, and a mixed crystal thereof.

4. The radiation detector according to claim 1, wherein the sensitive semiconductor film is composed of any of CdTe, ZnTe, and a mixed crystal thereof.

5. The radiation detector according to claim 4, wherein a halogen element is added to the sensitive semiconductor film.

6. A radiation detector for detecting radiation, comprising:
a conversion film, having a first surface and a second surface opposite to the first surface, for converting radiation incident on the first surface into an electric charge;
a plurality of first strip electrodes elongated in a first direction and arranged in parallel with each other on the second surface of the conversion film; and
a plurality of second strip electrodes elongated in a second direction intersecting the first direction and arranged in parallel with each other on the second surface of the conversion film,
the conversion film including a sensitive semiconductor film and at least one joining semiconductor film,
the sensitive semiconductor film being sensitive to the incident radiation to generate the electric charge, and
the joining semiconductor film being formed on a surface of the sensitive semiconductor film, the surface of the sensitive semiconductor film being on the side of the second surface, the joining semiconductor film covering at least an entire sensitive region in the surface of the sensitive semiconductor film, having a resistance value higher than resistance value of the sensitive semiconductor film, and achieving suppressed movement of the electric charge generated in the sensitive semiconductor film in directions in which the first strip electrodes and the second strip electrodes are arranged when the electric charge passes through the joining semiconductor film.

7. The radiation detector according to claim 6, wherein
the plurality of first strip electrodes and the plurality of second strip electrodes are each so separated as to divide the entire sensitive region of the conversion film in matrix, and the radiation detector further includes an incident position identifying circuit identifying a radiation incident position for every sensitive region divided in matrix in accordance with the electric charge read out with the separated first strip electrode and the separated second strip electrode.

8. The radiation detector according to claim 6, wherein the joining semiconductor film is composed of any of CdS, ZnS, ZnO, ZnSe, $Sb_2S_3$, and a mixed crystal thereof.

9. The radiation detector according to claim 6, wherein the sensitive semiconductor film is composed of any of CdTe, ZnTe, and a mixed crystal thereof.

10. The radiation detector according to claim 9, wherein a halogen element is added to the sensitive semiconductor film.

* * * * *